(12) United States Patent
Oshio et al.

(10) Patent No.: US 6,749,994 B2
(45) Date of Patent: Jun. 15, 2004

(54) PHOTOSENSITIVE INSULATING PASTE COMPOSITION AND PHOTOSENSITIVE FILM MADE THEREFROM

(75) Inventors: Kiminori Oshio, Kanagawa (JP); Tomoyuki Inoue, Kanagawa (JP); Hitoshi Setsuda, Kanagawa (JP); Hiroyuki Obiya, Kanagawa (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 29 days.

(21) Appl. No.: 10/135,619

(22) Filed: Apr. 30, 2002

(65) Prior Publication Data

US 2002/0164542 A1 Nov. 7, 2002

(30) Foreign Application Priority Data

May 1, 2001 (JP) ...................................... P.2001-133811

(51) Int. Cl.⁷ .......................... G03C 1/725; G03C 1/73; G03C 1/76; G03F 7/027; G03F 7/032
(52) U.S. Cl. ............... 430/281.1; 430/285.1; 430/911; 430/910; 430/916; 430/271.1
(58) Field of Search ............... 430/270.1, 911, 430/285.1, 905, 271.1, 910, 916, 281.1

(56) References Cited

U.S. PATENT DOCUMENTS

| | | | |
|---|---|---|---|
| 4,195,997 A | 4/1980 | Graham | 430/286.1 |
| 6,051,368 A | 4/2000 | Masuko et al. | 430/288.1 |
| 6,054,545 A * | 4/2000 | Oshio et al. | 527/301 |
| 6,326,125 B1 | 12/2001 | Kakinuma et al. | 430/281.1 |

FOREIGN PATENT DOCUMENTS

| | | |
|---|---|---|
| CN | 1293383 | 5/2001 |
| EP | 0278691 | 8/1988 |
| EP | 0887833 | 12/1998 |
| EP | 1 029 829 | 8/2000 |
| FR | 2 824 420 | 11/2002 |
| JP | 63265238 | 11/1988 |
| JP | 63-265238 | 11/1988 |
| JP | 2000298336 | 10/2002 |

OTHER PUBLICATIONS

International Search Report (Dutch Patent Office).

Int'l Search Report (FR).

* cited by examiner

Primary Examiner—Mark F. Huff
Assistant Examiner—Sin J. Lee
(74) Attorney, Agent, or Firm—Fish & Richardson P.C.

(57) ABSTRACT

A photosensitive insulating paste composition comprising: an organic component comprising the components of (A) a water-soluble cellulose derivative, (B) a photopolymerizable monomer, (C) an acrylic resin having a hydroxyl group, and (D) a photopolymerization initiator; and an inorganic powder.

9 Claims, No Drawings

PHOTOSENSITIVE INSULATING PASTE COMPOSITION AND PHOTOSENSITIVE FILM MADE THEREFROM

FIELD OF THE INVENTION

This invention relates to a photosensitive insulating paste composition and a photosensitive film made therefrom. More particularly, the invention relates to a photosensitive insulating paste composition comprising an organic component and an inorganic powder which has high sensitivity for precise patterning even when formed into a thick film and a photosensitive dry film made from the composition.

BACKGROUND OF THE INVENTION

Thick film multilayer circuit boards and various display panels have been produced by thick film screen printing techniques in which a photocuring insulating paste containing inorganic particles is screen printed on a substrate to form a pattern or photolithographic techniques in which a photocuring insulating paste composition is applied to a substrate, irradiated with ultraviolet rays, etc., and developed to form a relief pattern on the substrate. In particular, considerable attention has been devoted to plasma display panels (PDPs) for their relatively simple structure, large screen capability, self-luminescent high display quality, and color feasibility. A large number of proposals on PDPs have been made seeking for a larger scale and higher precision. APDP is a flat display panel composed a pair of glass substrates between which a vast number of cells are arrayed, being separated by barrier ribs made of an insulating material. Each cell, acting as a pixel, contains a phosphor, which is excited by ultraviolet rays generated by a plasma discharge to emit visible light. Electrodes, resistors, dielectrics, etc. for generating plasma are provided on the substrates and in the cells. In order to increase the precision of PDPs it is necessary to form the elements constructing the panel, i.e., barrier ribs, electrodes, resistors, dielectrics, phosphors, a color filter array, and a black matrix (hereinafter referred to as barrier ribs, etc.) with high precision. A higher precision patterning technique is still demanded therefor. Conventional thick film screen printing techniques, which involve repetition of printing a paste composition, have poor pattern position accuracy and difficulty in forming highly precise barrier ribs, etc. With photolithographic techniques, the film for forming barrier ribs, etc. is too thick for assuring sufficient photosensitivity over the whole thickness, which has been a bar to realization of high precision patterning. Besides, development involves use of expensive organic solvents such as trichloroethane, which not only leads to an increase of production cost but gives rise to such issues as environmental pollution and harm to human bodies. In an attempt to provide solutions for the problems associated with the development with an organic solvent, JP-A-63-265238 (The term "JP-A" as used herein means an "unexamined published Japanese patent application") discloses a water-developable photocuring insulating paste composition comprising a water-soluble cellulose such as methyl cellulose, a photopolymerizable polymer, a photopolymerization initiator, and an inorganic powder. However, the proposed composition has insufficient resistance against development so that the image areas are liable to be dissolved on developing. Moreover, because the composition is patternwise applied by screen printing, the pattern position accuracy is poor. The composition cannot therefore be seen as capable of high precision patterning in fabricating barrier ribs, etc.

SUMMARY OF THE INVENTION

In the light of these circumstances, the inventors of the present invention have conducted extensive investigations. They have found as a result that a photosensitive insulating paste composition comprising a water-soluble cellulose derivative, a photopolymerizable monomer, an acrylic resin having a hydroxyl group, a photopolymerization initiator, and an inorganic powder is easily aqueous- or alkaline-developable, free from the organic solvent problems such as environmental pollution or harm to human bodies, and exhibits high sensitivity enough to be formed into a thick film which is fit for fabricating barrier ribs, etc. and thick film multilayer circuits with high precision. The present invention has been reached based on this finding.

An object of the present invention is to provide a photosensitive insulating paste composition which is easily aqueous- or alkaline-developable, capable of forming a thick and yet highly sensitive photosensitive insulating paste composition layer, and capable of forming a pattern with high precision.

Another object of the invention is to provide a photosensitive dry film made of the above-described photosensitive insulating paste composition.

The above objects of the invention are accomplished by a photosensitive insulating paste composition comprising an organic component comprising the components of (A) a water-soluble cellulose derivative, (B) a photopolymerizable monomer, (C) an acrylic resin having a hydroxyl group, and (D) a photopolymerization initiator and an inorganic powder and a photosensitive film made of the composition.

DETAILED DESCRIPTION OF THE INVENTION

Containing a water-soluble cellulose derivative as a binder resin, the photosensitive insulating paste composition of the invention exhibits higher transmittances of radiations for exposure, such as ultraviolet radiation, excimer laser beams, X-rays, and electron beams, and capability of forming patterns with higher precision than conventional photosensitive insulating paste compositions containing acrylic resin binders.

Any known water-soluble cellulose derivatives can be used as component (A) with no particular limitation. Examples of useful water-soluble cellulose derivatives are carboxymethyl cellulose, hydroxyethyl cellulose, hydroxyethylmethyl cellulose, hydroxypropyl cellulose, ethylhydroxyethyl cellulose, carboxymethylethyl cellulose, and hydroxypropylmethyl cellulose. They may be used either individually or as a mixture of two or more thereof.

The photopolymerizable monomer which can be used as component (B) is not particularly limited, either. Suitable photopolymerizable monomers include ethylene glycol diacrylate, ethylene glycol dimethacrylate, triethylene glycol diacrylate, triethylene glycol dimethacrylate, trimethylolpropane triacrylate, trimethylolpropane trimethacrylate, trimethylolethane triacrylate, trimethylolethane trimethacrylate, pentaerythritol diacrylate, pentaerythritol dimethacrylate, pentaerythritol triacrylate, pentaerythritol trimethacrylate, pentaerythritol tetraacrylate, pentaerythritol tetramethacrylate, dipentaerythritol tetraacrylate, dipentaerythritol tetramethacrylate, dipentaerythritol pentaacrylate, dipentaerythritol pentamethacrylate, dipentaerythritol hexaacrylate, dipentaerythritol hexamethacrylate, glycerol acrylate, glycerol methacrylate, carboepoxy diacrylate; fumaric esters, itaconic esters and maleic esters corresponding to these (meth)acrylic esters.

The acrylic resin having a hydroxyl group which can be used as component (C) includes polymers mainly comprising an acrylic ester monomer and a hydroxyl-containing monomer and, if necessary, other copolymerizable monomers. Suitable acrylic ester monomers include acrylic acid or methacrylic acid esters with monohydric alcohols having 1 to 20 carbon atoms. Suitable hydroxyl-containing monomers include monoesters of glycols having 1 to 10 carbon atoms with acrylic acid or methacrylic acid, such as hydroxymethyl acrylate, hydroxymethyl methacrylate, 2-hydroxyethyl acrylate, 2-hydroxyethyl methacrylate, 2-hydroxypropyl acrylate, 2-hydroxypropyl methacrylate, 3-hydroxypropyl acrylate, 3-hydroxypropyl methacrylate, 2-hydroxybutyl acrylate, 2-hydroxybutyl methacrylate, 3-hydroxybutyl acrylate, 3-hydroxybutyl methacrylate, 3-hydroxybutyl acrylate, and 4-hydroxybutyl methacrylate; glycerol acrylate, glycerol methacrylate, dipentaerythritol monoacrylate, dipentaerythritol monomethacrylate, ε-caprolactone-modified hydroxyethyl acrylate, ε-caprolactone-modified hydroxyethyl methacrylate, and epoxy ester compounds such as 2-hydroxy-3-phenoxypropyl acrylate.

The other monomers copolymerizable with the hydroxyl-containing monomers include α,β-unsaturated carboxylic acids, such as acrylic acid, methacrylic acid, itaconic acid, citraconic acid, maleic acid, and fumaric acid, and anhydrides or half esters thereof; α,β-unsaturated carboxylic acid esters, such as methyl acrylate, ethyl acrylate, n-propyl acrylate, isopropyl acrylate, n-butyl acrylate, isobutyl acrylate, sec-butyl acrylate, cyclohexyl acrylate, 2-ethylhexyl acrylate, stearyl acrylate, methyl methacrylate, ethyl methacrylate, n-propyl methacrylate, isopropyl methacrylate, sec-propyl methacrylate, n-butyl methacrylate, isobutyl methacrylate, sec-butyl methacrylate, cyclohexyl methacrylate, 2-ethylhexylmethacrylate, stearylmethacrylate, 2,2,2-trifluoromethyl acrylate, and 2,2,2-trifluoromethyl methacrylate; styrene and derivatives thereof, such as α-methylstyrene and p-vinyltoluene. Also included are acrylonitrile, methacrylonitrile, acrylamide, methacrylamide, vinyl acetate, glycidyl acrylate, and glycidyl methacrylate. These comonomers may be used either individually or as a combination thereof.

Containing the hydroxyl-containing acrylic resin, the photosensitive insulating paste composition of the invention exhibits improved development resistance to provide high precision images.

The photosensitive insulating paste composition preferably comprises 10 to 50 parts by weight, particularly 20 to 40 parts by weight, especially 25 to 35 parts by weight, of water-soluble cellulose derivative as component (A) and 50 to 90 parts by weight, particularly 60 to 80 parts by weight, especially 65 to 75 parts by weight, of the photopolymerizable monomer as component (B) per 100 parts by weight of the total of components (A) and (B). Where the amounts of these components are less or more than the respective preferred ranges, the composition tends to fail to assure sufficient patterning precision and have a reduced transmittance of radiation for exposure. For example, if the proportion of component (B) is less than 50 parts, photopolymerization of the composition tends to be insufficient so that the image area dissolves in developing, resulting in a failure of image formation. If the proportion of component (B) exceeds 90 parts, fine line resolution reduces.

The photosensitive insulating paste composition preferably comprises 50 to 90 parts by weight, particularly 60 to 80 parts by weight, especially 60 to 70 parts by weight, of water-soluble cellulose derivative as component (A) and 10 to 50 parts by weight, particularly 20 to 40 parts by weight, especially 30 to 40 parts by weight, of the hydroxyl-containing acrylic resin as component (C) per 100 parts by weight of the total of components (A) and (C). Where the amounts of these components are less than or more than the respective preferred ranges, the composition tends to fail to assure sufficient precision in patterning and have a reduced transmittance of active radiation. For example, a proportion of component (C) less than 10 parts is insufficient for development resistance, leading to a failure of image formation. If the proportion of component (C) exceeds 50 parts, developability reduces to cause some part of non-exposed area to remain.

Any known photopolymerization initiator can be used as component (D). Included are benzophenones, benzoins, benzoin alkyl ethers, acetophenones, aminoacetophenones, benzils, benzyl alkyl ketals, anthraquinones, ketals, and thioxanthones. Examples are 2,4-bis(trichloromethyl)-6-(3-bromo-4-methoxy)phenyl-s-triazine, 2,4-bis(trichloromethyl)-6-(2-bromo-4-methoxy)phenyl-s-triazine, 2,4-bis(trichloromethyl)-6-(3-bromo-4-methoxy)styrylphenyl-s-triazine, 2,4-bis(trichloromethyl)-6-(2-bromo-4-methoxy)styrylphenyl-s-triazine, 2,4,6-trimethylbenzoyldiphenylphosphine oxide, 1-[4-(2-hydroxyethoxy)phenyl]-2-hydroxy-2-methyl-1-propan-1-one, 2,4-diethylthioxanthone, 2,4-dimethylthioxanthone, 2-chlorothioxanthone, 1-chloro-4-propoxythioxanthone, 3,3-dimethyl-4-methoxybenzophenone, benzopheneone, 1-(4-isopropylphenyl)-2-hydroxy-2-methylpropan-1-one, 1-(4-dodecylphenyl)-2-hydroxy-2-methylpropan-1-one, 4-benzoyl-4'-methyldimethyl sulfide, 4-dimethylaminobenzoic acid, methyl 4-dimethylaminobenzoate, ethyl 4-dimethylaminobenzoate, butyl 4-dimethylaminobenzoate, 2-ethylhexyl 4-dimethylaminobenzoate, 2-isoamyl 4-dimethylaminobenzoate, 2,2-diethoxyacetophenone, benzyl dimethyl ketal, benzyl-β-methoxyethyl acetal, 1-phenyl-1,2-propanedione-2-(O-ethoxycarbonyl)oxime, methyl o-benzoylbenzoate, bis(4-dimethylaminophenyl)ketone, 4,4'-bisdiethylaminobenzophenone, benzil, benzoin, benzoin methyl ether, benzoin ethyl ether, benzoin isopropyl ether, benzoin n-butyl ether, benzoin isobutyl ether, p-dimethylaminoacetophenone, p-t-butyltrichloroacetophenone, p-t-butyldichloroacetophenone, thioxanthone, 2-methylthioxanthone, 2-isopropylthioxanthone, dibenzosuberone, α,α-dichloro-4-phenoxyacetophenone, pentyl 4-dimethylaminobenzoate, and 2-(o-chlorophenyl)-4,5-diphenylimidazolyl dimer. They may be used either individually or as a combination of two or more thereof.

The photopolymerization initiator is suitably used in an amount of 0.1 to 10 parts by weight, preferably 0.2 to 5 parts by weight, per 100 parts by weight of the total of components (A) and (B). Where the amount of the initiator is less than 0.1 part, the composition has reduced curability. Where it is more than 10 parts, absorption by the initiator tends to cause undercure in the vicinity of the substrate.

If desired, the photosensitive insulating paste composition can comprise additives, such as ultraviolet absorbers, sensitizers, sensitization assistants, polymerization inhibitors, plasticizers, thickeners, organic solvents, dispersants, defoaming agents, and organic or inorganic suspension stabilizers.

Examples of useful sensitizers, which can be added to improve the sensitivity, are 2,4-diethylthioxanthone, isopropylthioxanthone, 2,3-bis(4-diethylaminobenzal)cyclopentanone, 2,6-bis(4-dimethylaminobenzal)

cyclohexanone, 2,6-bis(4-dimethylaminobenzal)-4-methylcyclohexanone, 4,4-bis(dimethylamino) benzophenone (Michler's ketone), 4,4-bis(diethylamino) benzophenone, 4,4-bis(dimethylamino)chalcone, 4,4-bis(diethylamino)chalcone, p-dimethylaminocinnamylideneindanone, p-dimethylaminobenzylideneindazone, 2-(p-dimethylaminophenylvinylene)isonaphthothiazole, 1,3-bis(4-dimethylaminobenzal)acetone, 1,3-carbonyl-bis(4-diethylaminobenzal)acetone, 3,3-carbonyl-bis(7-diethylaminocoumarin), N-phenyl-N-ethylethanoamine, N-phenylethanolamine, N-tolyldiethanolamine, N-phenylethanolamine, isoamyl dimethylaminobenzoate, isoamyl diethylaminobenzoate, 3-phenyl-5-benzoylthiotetrazole, and 1-phenyl-5-ethoxycarbonylthiotetrazole. These sensitizers may be used either individually or as a combination of two or more thereof.

Examples of useful polymerization inhibitors, which are added to improve heat stability during storage, include hydroquinone, hydroquinone monoesters, N-nitrosodiphenylamine, phenothiazine, p-t-butylcatechol, N-phenylnaphthylamine, 2,6-di-t-butyl-p-methylphenol, chloranil, and pyrogallol.

Examples of suitable plasticizers which are added to improve conformability to a substrate include dibutyl phthalate (DBP), dioctyl phthalate (DOP), polyethylene glycol, glycerol, and dibutyl tartrate.

Examples of defoaming agents, which can be added to reduce air bubbles in the paste or film thereby to reduce void formation on baking, include alkylene glycols (e.g., polyethylene glycol having a molecular weight of 400 to 800), silicone defoaming agents, and higher alcohols.

The inorganic powder which can be used in the present invention is not particularly limited as long as it is transparent to light used for exposure. Included are glass, ceramics (e.g., cordierite), and metals. Examples are powder of borosilicate lead glass, borosilicate zinc glass or borosilicate bismuth glass (i.e., $PbO—SiO_2$ glass, $PbO—B_2O_3—SiO_2$ glass, $ZnO-SiO_2$ glass, $ZnO—B_2O_3—SiO_2$ glass, $BiO-SiO_2$ glass, and $BiO—B_2O_3—SiO_2$ glass); powdered oxides of Na, K, Mg, Ca, Ba, Ti, Zr, Al, etc., such as cobalt oxide, iron oxide, chromium oxide, nickel oxide, copper oxide, manganese oxide, neodymium oxide, vanadium oxide, ceriumoxide, titaniumdioxide (Tipaque Yellow), cadmium oxide, ruthenium oxide, silica, magnesia, and spinel; fluorescent powders, such as $ZnO:Zn$, $Zn_3(PO_4)_2:Mn$, $Y_2SiO_5:Ce$, $CaWO_4:Pb$, $BaMgAl_{14}O_{23}:Eu$, $ZnS:(Ag, Cd)$, $Y_2O_3:Eu$, $Y_2SiO_5:Eu$, $Y_3Al_5O_{12}:Eu$, $YBO_3:Eu$, $(Y, Gd)BO_3:Eu$, $GdBO_3:Eu$, $ScBO_3:Eu$, $LuBO_3:Eu$, $Zn_2SiO_4:Mn$, $BaAl_{12}O_{19}:Mn$, $SrAl_{13}O_{19}:Mn$, $CaAl_{12}O_{19}:Mn$, $YBO_3:Tb$, $BaMgAl_{14}O_{23}:Mn$, $LuBO_3:Tb$, $GdBO_3:Tb$, $ScBO_3:Tb$, $Sr_6Si_3O_3Cl_4:Eu$, $ZnS:(Cu, Al)$, $ZnS:Ag$, $Y_2O_2S:Eu$, $ZnS:Zn$, $(Y, Cd)BO_3:Eu$, and $BaMgAl_{12}O_{23}:Eu$; powdered metals, such as iron, nickel, palladium, tungsten, copper, aluminum, silver, gold, and platinum. Glass and ceramic powders are particularly preferred for their high transparency. Glass powders (glass frits) are the most effective. It is desirable that the inorganic powder be free from silicon oxide, aluminum oxide or titanium oxide. Presence of these impurities reduces light transmittance.

A suitable particle size of the inorganic powder is usually 1 to 10 μm, preferably 2 to 8 μm, while varying according to the pattern configuration to be formed. Particles greater than 10 μm in average cause surface unevenness, which is unfavorable for high precision patterning. Particles smaller than 1 μm in average cause formation of microvoids on baking, which can cause an insulation failure. The inorganic powder can have a spherical form, a block form, a flaky form, a dendritic form, or a mixture thereof.

The photosensitive insulating paste composition can contain an inorganic pigment of black, red, blue, green, etc. as an inorganic powder to provide a colored pattern, which is fit for the manufacture of color filter arrays, etc. for PDPs. The inorganic powder may be a mixture of particles different in physical properties. For example, a combined use of glass particles or ceramic particles having different thermal softening points is effective to control the shrinkage on baking. The shapes and the physical properties of inorganic powders are combined appropriately according to the characteristics required of barrier ribs, etc.

In order to prevent secondary agglomeration or improve dispersibility of the inorganic powder, being in the range of particle size of 1 to 10 μm, the particles can be surface treated with organic acids, inorganic acids, silane coupling agents, titanate coupling agents, aluminum coupling agents, surface active agents, or the like in such a range that does not impair the properties of the inorganic powder. The surface treatment is conveniently carried out by dissolving a treating agent in an organic solvent or water, adding the inorganic powder thereto, and removing the solvent by heating the mixture with stirring at about 50 to 200° C. for 2 hours or longer. Otherwise, the treating agent may be added in preparing paste.

The photosensitive insulating paste composition preferably comprises 10 to 35 parts by weight, particularly 15 to 30 parts by weight, especially 20 to 25 parts by weight, of the organic component comprising components (A) to (D) and 65 to 90 parts by weight, particularly 70 to 85 parts by weight, especially 75 to 80 parts by weight, of the inorganic powder per 100 parts by weight of the total composition. Where the proportion of the organic component is less than 15 parts, photopolymerization would be insufficient so that image areas would dissolve in developing, resulting in a failure to form images. Where it exceeds 35 parts, the pattern tends to separate on baking.

The photosensitive insulating paste composition is prepared by dissolving and/or dispersing the above-described components in a solvent. Any solvent that has good affinity to the inorganic powder, sufficient dissolving power for the organic component, capability of imparting moderate viscosity to the paste composition, and easy removability by evaporation can be used. Suitable solvents include ketones, such as diethyl ketone, methyl butyl ketone, dipropyl ketone, and cyclohexanone; alcohols, such as n-pentanol, 4-methyl-2-pentanol, cyclohexanol, and diacetone alcohol; ether alcohols, such as ethylene glycol monomethyl ether, ethylene glycol monoethyl ether, ethylene glycol monobutyl ether, propylene glycol monomethyl ether, propylene glycol monoethyl ether, diethylene glycol monomethyl ether, diethylene glycol monoethyl ether, diethylene glycol dimethyl ether, and diethylene glycol diethyl ether; saturated aliphatic monocarboxylic acid alkyl esters, such as n-butyl acetate and amyl acetate; lactic esters, such as ethyl lactate and n-butyl lactate; and ether esters, such as methyl cellosolve acetate, ethyl cellosolve acetate, propylene glycol monomethyl ether acetate, propylene glycol monoethyl ether acetate, ethyl 3-ethoxypropionate, 2-methoxybutylacetate, 3-methoxybutylacetate, 4-methoxybutyl acetate, 2-methyl-3-methoxybutyl acetate, 3-methyl-3-methoxybutyl acetate, 3-ethyl-3-methoxybutyl acetate, 2-ethoxybutyl acetate, 4-ethoxybutyl acetate, 4-propoxybutyl acetate, and 2-methoxypentyl acetate. These solvents can be used either individually or as a combination of two or more thereof.

A preferred amount of the solvent to be used for maintaining the paste composition in a suitable viscosity range is 300 parts by weight or less, particularly 10 to 70 parts by weight, especially 25 to 35 parts by weight, per 100 parts by weight of the total amount of the organic component and the inorganic powder.

The photosensitive insulating paste composition of the invention can be applied as liquid onto a substrate by spread coating or screen printing according to the use. Where high precision is demanded as in the formation of barrier ribs, etc. of PDPs, it is convenient to use a photosensitive dry film made of the paste composition to secure higher precision in patterning. A dry film is prepared by applying the photosensitive paste composition to a carrier film to a dry thickness of 10 to 100 µm and drying the coating layer. The carrier film includes 15 to 125 µm thick flexible films of synthetic resins, such as polyethylene terephthalate, polyethylene, polypropylene, polycarbonate, and polyvinyl chloride. If necessary, release treatment may be given to the carrier film to facilitate film transfer. Application of the composition can be carried out by means of an applicator, a bar coater, a wire bar coater, a roll coater, a curtain flow coater, etc. A roll coater is preferred for film thickness uniformity and efficiency of thick film formation. The dry film is protected until use by a cover sheet. An about 15 to 125 µm thick film of polyethylene terephthalate, polypropylene, polyethylene, etc. having a silicone release (baked) coating is suitable as a cover sheet.

Pattern formation by the use of the photosensitive insulating paste composition can be carried out as follows. A layer of the photosensitive insulating paste composition formed on a substrate by coating or transfer is imagewise exposed to ultraviolet radiation, excimer laser radiation, X-rays or electron beams through a mask and developed with an alkaline developer or water to remove the unexposed area. If necessary, the relief pattern thus formed is baked. It is also possible that the entire area of the photosensitive layer is exposed to light and then patterned without developing, followed by baking if desired. Where a pattern of the highest precision is desired, the above-described photosensitive dry film is employed. The cover sheet is stripped off, and the dry film is transferred onto a substrate. The dry film is exposed to light either imagewise or all over, and the carrier film is then removed. The imagewise exposed film is developed to form a pattern. The entirely exposed film provides a cured film without developing, which is then baked if desired. The substrate includes a glass plate, a glass plate having electrodes (e.g., bus electrodes) formed thereon, and a ceramic plate. The dry film can conveniently be transferred to the substrate by thermal lamination using a hot-roll laminator, etc. Thermal lamination with a hot-roll laminator is performed under conditions of substrate surface temperature: 80 to 140° C.; roll pressure: 1 to 5 kg/cm²; and running speed: 0.1 to 10.0 m/min. The substrate can be preheated, e.g., to 40 to 100° C. Radiation emitters which can be used for exposure include ultraviolet emitters generally used in photolithography and aligners used in the manufacture of semiconductors and liquid crystal displays (LCDs).

The alkali component of the alkaline developer which can be used for developing includes hydroxides, carbonates, hydrogencarbonates, phosphates or pyrophosphates of alkali metals, e.g., lithium, sodium, and potassium; primary amines, such as benzylamine and butylamine; secondary amines, such as dimethylamine, dibenzylamine, and dietha-nolamine; tertiary amines, such as trimethylamine, triethylamine, and triethanolamine; cyclic amines, such as morpholine, piperazine, and pyridine; polyamines, such as ethylenediamine and hexamethylenediamine; ammonium hydroxides, such as tetramethylammonium hydroxide, tetraethylammonium hydroxide, trimethylbenzylammonium hydroxide, and trimethylphenylbenzylammonium hydroxide; sulfonium hydroxides, such as trimethylsulfonium hydroxide, trimethylsulfonium hydroxide, diethylmethylsulfonium hydroxide, and dimethylbenzylsulfonium hydroxide; choline; and silicate-containing buffers. A proper choice is to be made according to the characteristics of the insulating composition as to the developing method (e.g., dip development, rocking development, shower development, spray development or paddle development), the development unit, and the developing conditions, such as type, composition, and concentration of the developer, and developing time and temperature.

The baking temperature is selected so as to burn out any organic matter of the cured composition. For example, baking is performed at 400 to 600° C. for 10 to 90 minutes.

The photosensitive insulating paste composition of the invention is useful to form thick film multilayer circuits and various displays including PDPs and plasma-addressed LCDs. It is particularly suited for the formation of barrier ribs, etc. of PDPs, especially dielectrics of PDPs, which demand highly accurate patterning.

EXAMPLES

The present invention will now be illustrated with reference to Examples, but it should be understood that the invention is not construed as being limited thereto. Unless otherwise noted, all the percents, parts, and ratios are by weight.

Example 1

Preparation of Photosensitive Insulating Paste Composition

Twenty-two parts of hydroxypropyl cellulose as component (A), 14 parts of a styrene-hydroxyethyl methacrylate (55/45) copolymer (Mw=40,000) as component (B), 60 parts of 2-methacryloyloxyethyl 2-hydroxypropylphthalate (HO-MPP, available from Kyoeisha Chemical Co., Ltd.) as component (C), 0.9 part of 2,2-dimethoxy-2-phenylacetophenone (IR-651, available from Ciba Geigy-Ltd.) as component (D), 3.9 parts of butyl tartrate as a plasticizer, 0.1 part of an azo dye (Dye SS, available from Daito Chemix Corp.) as an ultraviolet absorber, and 100 parts of 3-methoxy-3-methylbutanol as a solvent were mixed in an agitator for 3 hours to prepare an organic component mixed solution having a solids content of 50%. Forty parts of the organic component mixed solution and 80 parts of glass frits were kneaded to prepare a photosensitive insulating paste composition.

Evaluation

The resulting paste was applied to a glass substrate to a dry thickness of 40 µm and exposed to ultraviolet rays from an ultrahigh-pressure mercury lamp at an exposure dose of 400 mJ/cm² through a mask with square test pattern. The exposed layer was developed by spraying with water at 30° C. under a spray pressure of 3.0 kg/cm² for 30 seconds. The minimum line width, taken as a measure of pattern adhesion, was 60 µm.

A pattern was formed in the same manner as described above by using a mask with 200 µm wide line pattern. The pattern was baked by heating at a rate of 10° C./min up to 520° C., at which the patter was kept for 30 minutes. As a result, the baked pattern retained a satisfactory shape.

Example 2

Preparation of Photosensitive Insulating Paste Composition

Twenty-two parts of hydroxypropyl cellulose as component (A), 14 parts of a styrene-hydroxyethyl methacrylate (55/45) copolymer (Mw=40,000) as component (B), 63 parts of 2-methacryloyloxyethyl 2-hydroxypropylphthalate (HO-MPP, available from Kyoeisha Chemical Co., Ltd.) as component (C), 0.9 part of 2,2-dimethoxy-2-phenylacetophenone (IR-651, available from Ciba Geigy-Ltd.) as component (D), 0.1 part of an azo dye (Dye SS, available from Daito Chemix Corp.) as an ultraviolet absorber, and 100 parts of 3-methoxy-3-methylbutanol as a solvent were mixed in an agitator for 3 hours to prepare an organic component mixed solution having a solids content of 50%. Fifty parts of the organic component mixed solution and 75 parts of glass frits were kneaded to prepare a photosensitive insulating paste composition.

Preparation of Photosensitive Dry Film

The paste composition was applied to a polyethylene terephthalate (PETP) carrier film with a slot coater and dried at 100° C. for 6 minutes to completely remove the solvent to form a photosensitive dry film having a thickness of 40 $\mu$m. A 25 m thick polyethylene cover sheet was overlaid on the photosensitive dry film.

Evaluation

The resulting dry film was transferred to a glass substrate preheated to 80° C. while stripping off the cover sheet by passing through a hot-roll laminator set at 105° C. The air pressure was 3 kg/cm$^2$, and the laminating speed was 1.0 m/min. The transferred dry film was exposed to ultraviolet light from an ultrahigh-pressure mercury lamp at a dose of 400 mJ/cm$^2$ through a square pattern test mask. The PETP carrier film was then stripped off. No release marks was left on the exposed dry film. The exposed dry film was developed by spraying with water at 30° C. under a spraying pressure of 3 kg/cm$^2$ for 30 seconds to remove the unexposed area thereby to leave a relief pattern. The minimum line width was 60 $\mu$m.

When the pattern was baked by heating at a rate of 10° C./min up to 580° C. and maintaining at that temperature for 30 minutes, a satisfactory baked pattern was obtained.

Comparative Example 1

A photosensitive dry film was prepared and evaluated in the same manner as in Example 2, except that the paste composition was prepared by kneading 10 parts of the organic component mixed solution and 95 parts of glass frits. When the PETP carrier film was released, the photosensitive dry film separated from the glass substrate.

Comparative Example 2

A photosensitive dry film was prepared and evaluated in the same manner as in Example 2, except that the paste composition was prepared by kneading 80 parts of the organic component mixed solution and 60 parts of glass frits. When the resulting pattern was baked, separation from the substrate was observed at the edges of the pattern.

The photosensitive insulating paste composition according to the present invention is aqueous- or alkaline-developable to leave a pattern with high precision and is so sensitive that a thick film insulator pattern can be formed with good precision. The photosensitive insulating paste composition is of high industrial value, making it feasible to economically produce PDPs which demand highly precise patterning.

This application is based on Japanese Patent application JP 2001-133811, filed May 1, 2001, the entire content of which is hereby incorporated by reference, the same as if set forth at length.

What is claimed is:

1. A photosensitive insulating paste composition comprising:

an organic component comprising the components of (A) a water-soluble cellulose derivative, wherein the water-soluble cellulose derivative is carboxymethyl cellulose, hydroxyethyl cellulose, hydroxyethylmethyl cellulose, hydroxypropyl cellulose, ethylhydroxyethyl cellulose, carboxymethylethyl cellulose, or hydroxypropylmethyl cellulose or mixtures thereof, (B) a photopolymerizable monomer, (C) an acrylic resin having a hydroxyl group, and (D) a photopolymerization initiator;

and an inorganic powder which is at least one of glass and ceramics, and wherein the organic component comprises 50 to 90 parts by weight of the component (A) and 10 to 50 parts by weight of the component (C) per 100 parts by weight of the total of the components (A) and (C).

2. The photosensitive insulating paste composition according to claim 1, wherein the inorganic powder is glass powder.

3. A photosensitive film comprising a carrier film and the photosensitive insulating paste composition according to claim 2.

4. The photosensitive insulating paste composition according to claim 1, wherein the organic component comprises 10 to 50 parts by weight of the component (A) and 50 to 90 parts by weight of the component (B) per 100 parts by weight of the total of the components (A) and (B).

5. A photosensitive film comprising a carrier film and the photosensitive insulating paste composition according to claim 4.

6. The photosensitive insulating paste composition according to claim 1, which comprises 10 to 35 parts by weight of the organic component and 65 to 90 parts by weight of the inorganic powder per 100 parts by weight of the total of the organic component and the inorganic powder.

7. A photosensitive film comprising a carrier film and the photosensitive insulating paste composition according to claim 6.

8. The photosensitive insulating paste composition according to claim 1, wherein the inorganic powder has particle size of 1 to 10 $\mu$m.

9. A photosensitive film comprising a carrier film and the photosensitive insulating paste composition according to claim 1.

* * * * *